US008461617B2

(12) United States Patent
Kadan et al.

(10) Patent No.: US 8,461,617 B2
(45) Date of Patent: Jun. 11, 2013

(54) SEMICONDUCTOR LIGHT EMITTING ELEMENT AND SEMICONDUCTOR LIGHT EMITTING DEVICE

(75) Inventors: Katsuyoshi Kadan, Anan (JP); Yoshiki Inoue, Anan (JP)

(73) Assignee: Nichia Corporation, Anan-Shi, Tokushima (JP)

( * ) Notice: Subject to any disclaimer, the term of this patent is extended or adjusted under 35 U.S.C. 154(b) by 221 days.

(21) Appl. No.: 13/060,951

(22) PCT Filed: Aug. 28, 2009

(86) PCT No.: PCT/JP2009/065043
§ 371 (c)(1),
(2), (4) Date: Feb. 25, 2011

(87) PCT Pub. No.: WO2010/024375
PCT Pub. Date: Mar. 4, 2010

(65) Prior Publication Data
US 2011/0156065 A1      Jun. 30, 2011

(30) Foreign Application Priority Data
Aug. 29, 2008   (JP) ................ 2008-222075

(51) Int. Cl.
*H01L 33/08* (2010.01)
(52) U.S. Cl.
USPC .......... 257/99; 257/81; 257/85; 257/91; 257/94
(58) Field of Classification Search
USPC ........ 257/99, 81, 85, 91, 94
See application file for complete search history.

(56) References Cited

U.S. PATENT DOCUMENTS 6,333,522 B1 * 12/2001 Inoue et al. ........ 257/99
6,417,525 B1    7/2002 Hata
(Continued)

FOREIGN PATENT DOCUMENTS
JP    8-250768    9/1996
JP    8-250769    9/1996
(Continued)

OTHER PUBLICATIONS

Notification of First Office Action corresponding to Korean Patent Application No. 10-2011-7003037 dated Mar. 14, 2012.
(Continued)

*Primary Examiner* — Eugene Lee
(74) *Attorney, Agent, or Firm* — Squire Sanders (US) LLP

(57) ABSTRACT

Provided is a semiconductor light emitting element wherein generation of an open failure of the light emitting device can be eliminated by ensuring a current pathway when disconnection is generated in a transparent electrode layer. A semiconductor light emitting element (10) is provided with: a first semiconductor layer (12) on a substrate (11); a light emitting layer (13) on the first semiconductor layer (12); a second semiconductor layer (14) on the light emitting layer (13); an insulator layer (15) provided with a hole portion (19) in a partial region on the second semiconductor layer (14); a transparent electrode layer (16) covering the upper surface of the insulator layer (15) and the second semiconductor layer (14) without covering the hole portion (19); and a second pad electrode (18) brought into contact with the second semiconductor layer (14) through the hole portion (19) and faces the insulator layer (15) with the transparent electrode layer (16) therebetween. Contact resistance between the second pad electrode (18) and the second semiconductor layer (14) is set larger than that between the transparent electrode layer (16) and the second semiconductor layer (14).

20 Claims, 7 Drawing Sheets

U.S. PATENT DOCUMENTS

| | | | |
|---|---|---|---|
| 7,183,583 B2 * | 2/2007 | Lai et al. | 257/95 |
| 7,294,866 B2 * | 11/2007 | Liu | 257/100 |
| 7,511,311 B2 | 3/2009 | Kususe et al. | |
| 7,576,367 B2 * | 8/2009 | Sugimori | 257/99 |
| 8,106,415 B2 * | 1/2012 | Cheong | 257/98 |
| 8,134,176 B2 * | 3/2012 | Takeuchi et al. | 257/103 |

FOREIGN PATENT DOCUMENTS

| | | |
|---|---|---|
| JP | 9-36431 | 2/1997 |
| JP | 9-129921 | 5/1997 |
| JP | 9-129922 | 5/1997 |
| JP | 10-173224 | 6/1998 |
| JP | 11-4020 | 1/1999 |
| JP | 11-87772 | 3/1999 |
| JP | 2000-124502 | 4/2000 |
| JP | 2002-353506 | 12/2002 |
| JP | 2002-353506 A | 12/2002 |
| JP | 2003-124517 | 4/2003 |
| JP | 2003-174196 | 6/2003 |
| JP | 2004-140416 | 5/2004 |
| JP | 2004-186543 | 7/2004 |
| KR | 10-2005-0026551 | 3/2005 |
| WO | WO98/42030 | 9/1998 |
| WO | WO 2004/013916 A1 | 2/2004 |

OTHER PUBLICATIONS

International Search Report mailed Oct. 6, 2009 directed towards International application No. PCT/JP2009/065043; 3 pages.

* cited by examiner ically shown in FIG. 8B has been proposed (see, for example, Patent
SEMICONDUCTOR LIGHT EMITTING ELEMENT AND SEMICONDUCTOR LIGHT EMITTING DEVICE

REFERENCE TO RELATED APPLICATIONS

This application is a national stage application under 35 USC 371 of International Application No. PCT/JP2009/065043, filed Aug. 28, 2009, which claims priority from Japanese Patent Application No. 2008-222075, filed Aug. 29, 2008, the contents of which prior applications are incorporated herein by reference.

FIELD OF THE INVENTION

The present invention relates to a semiconductor light emitting element which is resistant to an open failure, and a semiconductor light emitting device using the semiconductor light emitting element.

BACKGROUND OF THE INVENTION

A semiconductor light emitting element using nitride semiconductors such as gallium nitride is capable of emitting an ultraviolet light, a blue light, a green light and the like and has a high light emitting efficiency and property of low power consumption, as well as the semiconductor light emitting element is easy to reduce a size, resistant to, for example, mechanical vibrations and has a long life and high reliability. Therefore, applications of the semiconductor light emitting element to a large scale display, a traffic light, a backlight of a liquid crystal display and the like have rapidly progressed, recently.

The semiconductor light emitting element generally has a stack structure provided with a light emitting layer between a n-type semiconductor layer and a p-type semiconductor layer and emits a light by recombination of an electron and a hole injected into the light emitting layer from the n-type semiconductor layer and the p-type semiconductor layer, respectively. Therefore, a technology of how to efficiently extract the light generated in the light emitting layer is the important technology that determines a characteristic (efficiency) of the light emitting device.

Hence, a semiconductor light emitting element having a structure provided with an n-type semiconductor layer, an n-side pad electrode disposed on a part of the n-type semiconductor layer, a light emitting layer widely disposed on the n-type semiconductor layer so as to separate from the n-side pad electrode, a p-type semiconductor layer disposed on the light emitting layer, an insulator layer disposed on a part of the p-type semiconductor layer, a transparent electro de layer covering an exposed surface of the p-type semiconductor layer and the insulator layer, and a p-side pad electrode disposed at a position facing the insulator layer across the transparent electrode layer has been known (see, for example, Patent Documents 1 to 5).

The n-side pad electrode and the p-side pad electrode are connected to an external circuit (power source), respectively by wire bonding or bump bonding in order to apply a voltage between the n-type semiconductor layer and the p-type semiconductor layer. In the semiconductor light emitting element described above, a light emission just below the p-side pad electrode can be suppressed, and a light toward the p-side pad electrode from the light emitting layer is reflected to a side of a light emitting surface (a contact surface between the transparent electrode layer and the p-type semiconductor layer) by the insulator layer to be output from the light emitting surface. As a result, a high light emitting power can be obtained.

In addition, as an another example, a structure has been proposed, in which an electrode layer having a high contact resistance or a semiconductor layer having a low electrical conductivity is disposed on the p-type semiconductor layer, and the p-side pad electrode is disposed on the electrode layer, while contacting with a transparent electrode layer (see, for example, Patent Documents 6 to 8). In the structure, a light emission just below the p-side pad electrode is suppressed, thereby resulting in high light emitting power.

However, in the semiconductor light emitting elements disclosed in the Patent Documents 1 to 5 and the Patent Documents 6 to 8, there is a common problem that a disconnection in the transparent electrode layer is likely to be caused. Explanation will be given of the problem in reference to FIG. 8A and FIG. 8B. FIG. 8A is a cross sectional view schematically showing a structure in the vicinity of the p-side pad electrode in a conventional semiconductor light emitting element. As shown in FIG. 8A, a semiconductor light emitting element 110A has a structure in which an insulator layer, or an electrode layer having a high contact resistance, or a semiconductor layer having a low electrical conductivity (hereinafter, referred to as an insulator layer and the like 112) is disposed on a surface of a p-type semiconductor layer 111, a transparent electrode layer 113A is disposed so as to cover these layers, and a p-side pad electrode 114A is disposed at a position facing the insulator layer and the like 112 across the transparent electrode layer 113A. Since the transparent electrode layer 113A is generally formed by sputtering, a film thickness of the transparent electrode layer 113A becomes thin at a step portion S (side face portion of the insulator layer and the like 112) of the transparent electrode layer 113A indicated by dotted lines in FIG. 8A. As a result, a breakdown or disconnection (so-called open failure) is likely to be caused at the step portion S due to current concentration.

In order to solve the foregoing problem, another semiconductor light emitting element with a structure schematically shown in FIG. 8B has been proposed (see, for example, Patent Documents 9 to 13). A semiconductor light emitting element 110B has the structure, in which the insulator layer and the like 112 is disposed on a surface of the p-type semiconductor layer 111, a transparent electrode layer 113B having a height substantially identical to that of the insulator layer and the like 112 is disposed on the p-type semiconductor layer 111, and a p-side pad electrode 114B is disposed so as to cover the insulator layer and the like 112 and a part of the transparent electrode layer 113B. By setting a contact area between the p-side pad electrode 114B and the transparent electrode layer 113B to be large, the contact area is prevented from generating a current concentration.

[Patent Document 1] JPn. Pat. Appln. KOKAI Publication No. H08-250768
[Patent Document 2] JPn. Pat. Appln. KOKAI Publication No. H09-36431
[Patent Document 3] JPn. Pat. Appln. KOKAI Publication No. H09-129921
[Patent Document 4] JPn. Pat. Appln. KOKAI Publication No. 2004-140416
[Patent Document 5] JPn. Pat. Appln. KOKAI Publication No. H09-129922
[Patent Document 6] JPn. Pat. Appln. KOKAI Publication No. H11-4020
[Patent Document 7] JPn. Pat. Appln. KOKAI Publication No. H11-87772
[Patent Document 8] JPn. Pat. Appln. KOKAI Publication No. 2003-174196

[Patent Document 9] JPn. Pat. Appln. KOKAI Publication No. H10-173224
[Patent Document 10] Pamphlet WO98/42030
[Patent Document 11] JPn. Pat. Appln. KOKAI Publication No. 2000-124502
[Patent Document 12] JPn. Pat. Appln. KOKAI Publication No. 2002-353506
[Patent Document 13] JPn. Pat. Appln. KOKAI Publication No. 2003-124517

SUMMARY OF THE INVENTION

However, as the semiconductor light emitting element 110B shown in FIG. 8B, if an area of the p-side pad electrode 114B is enlarged, an area where a light is absorbed by the p-side pad electrode 114B increases, and as a result, a light emitting area decreases. On the other hand, if the contact area between the p-side pad electrode 114B and the transparent electrode layer 113B is reduced, the open failure is likely to be caused by the current concentration as with the semiconductor light emitting element 110A shown in FIG. 8A.

When a light emitting apparatus is manufactured using a light emitting device, generally, a plurality of light emitting devices are connected in series. Therefore, if an open failure occurs in a transparent electrode layer of one of the plurality of light emitting devices, it happens that a current does not flow in all of the light emitting devices, in addition to no light emission of the light emitting device of the open failure, thereby resulting in losing a function as a light emitting apparatus. Therefore, it is important to avoid a generation of the open failure.

The present invention has been developed in consideration of the foregoing problem, and it is an object of the present invention to provide a semiconductor light emitting element which is capable of avoiding a generation of open failure of the semiconductor light emitting element by securing a current path if a disconnection is generated in a transparent electrode layer. In addition, it is another object of the present invention to provide a semiconductor light emitting device using the semiconductor light emitting element.

A semiconductor light emitting element according to the present invention includes: a first semiconductor layer; a light emitting layer disposed on the first semiconductor layer; a first pad electrode disposed on the first semiconductor layer so as to separate from the light emitting layer; a second semiconductor layer disposed on the light emitting layer; an insulator layer disposed on one part of areas of the second semiconductor layer and provided with a hole portion passing through in a thickness direction of the second semiconductor layer; a transparent electrode layer disposed continuously from the other part of areas of the second semiconductor layer to a part of an upper surface of the insulator layer; and a second pad electrode which is disposed in contact with the second semiconductor layer through the hole portion of the insulator layer and in contact with the transparent electrode layer at a position facing the insulator layer across the transparent electrode layer. In the semiconductor light emitting element, a contact resistance between the second pad electrode and the second semiconductor layer is larger than a contact resistance between the transparent electrode layer and the second semiconductor layer.

In the semiconductor light emitting element, when the transparent electrode layer is not disconnected, a current substantially does not flow between the second pad electrode and the second semiconductor layer because the contact resistance between the transparent electrode layer and the second semiconductor layer is different from the contact resistance between the second pad electrode and the second semiconductor layer, and a current flows between the transparent electrode layer and the second semiconductor layer. If the disconnection occurred in the transparent electrode layer, a current flows through a contact surface between the second pad electrode and the second semiconductor layer to form a current path by an overvoltage breakdown of the second semiconductor layer/light emitting layer/first semiconductor layer. Then, when a light emitting apparatus is formed using a plurality of the foregoing semiconductor light emitting elements, even if the disconnection occurred in the transparent electrode layer of one of the semiconductor light emitting elements, the current path is secured and the other semiconductor light emitting elements can be maintained to be capable of light emitting In the semiconductor light emitting element according to the present invention, it is preferable that a thickness of the insulator layer is 10 to 500 nm, a thickness of the transparent electrode layer is 20 to 400 nm, and a thickness of the second pad electrode is 400 to 2000 nm.

By forming the thicknesses as described above, resistances of the transparent electrode layer and the second pad electrode can be made small. In addition, when there is no disconnection in the transparent electrode layer, a generation of current concentration from the second pad electrode toward just below thereof can be avoided.

In the semiconductor light emitting element according to the present invention, it is preferable that a shape of an opening of the hole portion in the insulator layer is circular or substantially circular, and an area of the opening is not more than 80% of a contact area between the insulator layer and the second semiconductor layer.

Since the shape of the opening of the hole portion in the insulator layer is a shape of a contact surface between the second pad electrode and the second semiconductor layer, if the transparent electrode layer is disconnected, a distribution of current passing through the contact surface can be homogenized by forming the shape in circular or substantially circular. In addition, by forming the area of the opening of the hole portion in the insulator layer not more than 80% of the contact area between the insulator layer and the second semiconductor layer, a light absorption by the second pad electrode can be made small.

In the semiconductor light emitting element according to the present invention, it is preferable that an average diameter of the hole portion of the insulator layer is not less than 16 µm.

By forming the average diameter as described above, the semiconductor light emitting element can be prevented from generating an open failure.

In the semiconductor light emitting element according to the present invention, it is preferable that the first semiconductor layer is disposed on a predetermined substrate.

By forming the semiconductor light emitting element on the predetermined substrate, a semiconductor light emitting device provided with a plurality of semiconductor light emitting elements can be easily formed.

The semiconductor light emitting device according to the present invention includes a plurality of semiconductor light emitting elements each of whose first semiconductor layer is disposed on a predetermined substrate and at least two of the semiconductor light emitting elements are connected in series.

In addition, another semiconductor light emitting device according to the present invention includes a plurality of the semiconductor light emitting elements disposed on a predetermined substrate and at least two of the semiconductor light emitting elements are connected in series.

In these semiconductor light emitting devices according to the present invention, even if one semiconductor light emitting element becomes unable to emit a light, the semiconductor light emitting device can be prevented from becoming unable to emit light as a whole.

According to a semiconductor light emitting element of the present invention, the semiconductor light emitting element can be prevented from generating an open failure even if a disconnection occurs in the transparent electrode layer, because the second pad electrode is in direct contact with the second semiconductor layer and a current flows through the contact surface by forming a current path. Therefore, in a semiconductor light emitting device using a plurality of semiconductor light emitting elements, or in a semiconductor light emitting device using a plurality of semiconductor light emitting elements which are disposed on a single substrate, the semiconductor light emitting device can be prevented from generating the condition that the semiconductor light emitting device does not emit light as a whole.

DETAILED DESCRIPTION OF THE INVENTION

Hereinafter, embodiments of the present invention will be explained in detail by referring to drawings.

First Embodiment

Figure 1A:
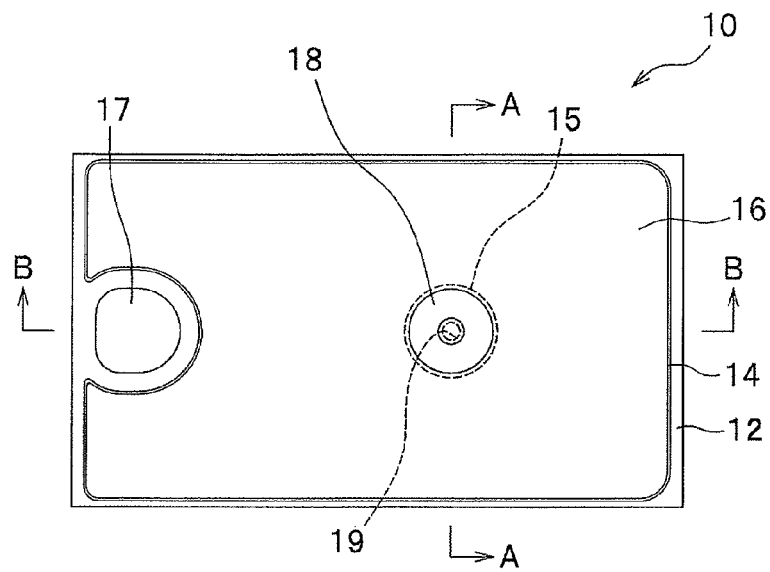
FIG. 1A is a top view showing a structure of a semiconductor light emitting element according to a first embodiment of the present invention.
Figure 1B:
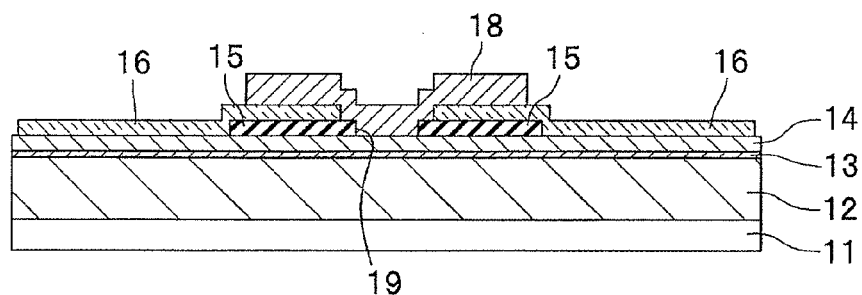
FIG. 1B is a cross sectional view showing the structure of the semiconductor light emitting element according to the first embodiment taken along A-A line of FIG. 1A.

A top view showing a brief structure of a semiconductor light emitting element according to the first embodiment of the present invention is shown in FIG. 1A, a cross sectional view taken along A-A line in FIG. 1A is shown in FIG. 1B, and a cross sectional view taken along B-B line in FIG. 1A is shown in FIG. 1B. This semiconductor light emitting element 10 includes a substrate 11, a first semiconductor layer 12, a light emitting layer 13, a second semiconductor layer 14, an insulator layer 15, a transparent electrode layer 16, a first pad electrode 17 and a second pad electrode 18.

Figure 1C:
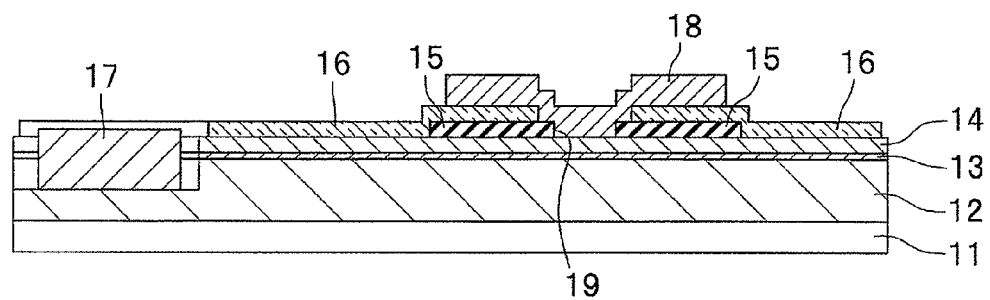
FIG. 1C is a cross sectional view showing the structure of the semiconductor light emitting element according to the first embodiment taken along B-B line of FIG. 1A.

In FIG. 1A to FIG. 1C, one semiconductor light emitting element 10 is formed on a single substrate 11, but the present invention is not limited to this. For example, a plurality of independent first semiconductor layers 12 may be formed on a surface of the single substrate 11, and each of the foregoing layers and each of the foregoing electrodes may be formed on each of the first semiconductor layers 12. An explanation will be given below of each foregoing element of the semiconductor light emitting element 10.

[Substrate]

As a material of the substrate 11, the material having a lattice matching which is capable of epitaxially growing a semiconductor (compound semiconductor) constituting the first semiconductor layer 12 is used. For example, $Al_2O_3$ (sapphire), $MgAl_2O_4$ (spinel), SiC, $SiO_2$, ZnS, ZnO, Si, GaAs, C (diamond), $LiNbO_3$ (lithium niobate), and $Nd_3Ga_5O_{12}$ (neodymium gallium garnet) may be used. An area and thickness of the substrate 11 are not limited specifically.

[First Semiconductor Layer]

The first semiconductor layer 12 to be formed on a surface of the substrate 11 is constituted by an n-type semiconductor material which is formed by doping an n-type dopant in III-V group compound semiconductors. As the III-V group compound semiconductors, for example, GaN, AlN and InN or $In_\alpha Al_\beta Ga_{1-\alpha-\beta}N$ ($0 \leq \alpha$, $0 \leq \beta$, $0 < \alpha + \beta \leq 1$) which is a mixed crystal of GaN, AlN and InN, III-V group compound semiconductors which are formed in such a manner that a part of or all of III-group element in the $In_\alpha Al_\beta Ga_{1-\alpha-\beta}N$ are substituted by, for example, B, or a part of N is substituted by other V-group elements such as P, As and Sb, GaAs-based compound semiconductors (for example, AlGaAs, InGaAs), InP-based compound semiconductors (for example, AlGaInP), and III-V group compound semiconductors such as InGaAsP which is a mixed crystal of GaAs-based compound semiconductor and InP-based compound semiconductor, may be used. In addition, as a n-type dopant, for example, Si, Ge, Sn, S, O, Ti and Zr, which are IV-group element or VI-group element, may be used.

[Second Semiconductor Layer]

The second semiconductor layer 14 to be formed on a surface of the light emitting layer 13 is constituted by a p-type semiconductor material which is formed by doping a p-type dopant in III-V group compound semiconductors. The III-V group compound semiconductors to be used for the second semiconductor layer 14 are identical to the III-V group compound semiconductors to be used for the first semiconductor layer 12. Then, the descriptions will be omitted. As the p-type dopant, for example, Be, Zn, Mn, Cr, Mg and Ca may be used.

[Light Emitting Layer]

The light emitting layer 13 is formed on a surface of the first semiconductor layer 12 so as to separate from the first pad electrode 17, while securing a formation area of the first pad electrode 17, which is connected to a predetermined power source, on the first semiconductor layer 12. The light emitting layer 13 has a function to radiate energy as a light which is generated by recombination of electrons and holes injected from the first semiconductor layer 12 and the second semiconductor layer 14, respectively. In order to effectively develop the function, it is preferable that the light emitting layer 13 has a quantum well structure including a well layer and a barrier layer as a quantum structure.

Specifically, a semiconductor material constituting the light emitting layer 13 may be any one of a non-doped semiconductor, an n-type impurity doped semiconductor and a p-type impurity doped semiconductor. Especially, the non-doped semiconductor or the n-type impurity doped semiconductor is preferably used. Here, an undoped semiconductor may be used for the well layer and the n-type impurity doped semiconductor may be used for the barrier layer. In the quantum well structure, a wavelength of a light to be produced in the light emitting layer 13 can be adjusted by a species and an amount of the dopant doped in the well layer. For example, when the light emitting layer 13 consists of a III-V group compound semiconductor, a light having a wavelength of about 60-650 nm, preferably 380-560 nm, may be emitted. If the well layer contains Al, a light having a wavelength range which is unable to achieve by a conventional well layer of InGaN, specifically, about 365 nm that corresponds to a band gap energy of GaN, or shorter wavelength can be obtained. Then, depending on, for example, an application of the semiconductor light emitting element 10, a species and an amount of the dopant doped in the well layer may be set in order to adjust a wavelength of the emitting light.

Modified Example of First Semiconductor Layer/Light Emitting Layer/Second Semiconductor Layer Here, a brief explanation will be given of a modified example of the first semiconductor layer 12/light emitting layer 13/second semiconductor layer 14. As a first modified example, a structure that stacks a contact layer/a clad layer in this order on the substrate 11 may be used as the first semiconductor layer 12, and similarly, a structure that stacks a clad layer/a contact layer in this order on the light emitting layer 13 may be used as the second semiconductor layer 14. As a second modified example, a structure that forms a buffer layer between the substrate 11 and the first semiconductor layer 12, forms the light emitting layer 13 on the buffer layer, in addition, forms a buffer layer on the second semiconductor layer 14 and forms the insulator layer 15 as well as the transparent electrode layer 16 on the buffer layer, may be used. As a third modified example, the first semiconductor layer 12 and the second semiconductor layer 14 each having a multi-layer structure that stacks an undoped semiconductor layer and a doped semiconductor layer alternately may be used.

[First Pad Electrode]

The first pad electrode 17 has a role as a terminal for electrically connecting a predetermined power source and the first semiconductor layer 12, and a role as a terminal for connecting a plurality of the semiconductor light emitting elements 10 in series (see FIG. 2A and FIG. 2B, which will be described later). In the semiconductor light emitting element 10, as shown in FIG. 1A and FIG. 1C, the first pad electrode 17 is formed on a step surface which is formed by cutting a part of an upper surface of the first semiconductor layer 12, in order to separate (not to directly contact with each other) the light emitting layer 13 formed on an upper surface of the first semiconductor layer 12 from the first pad electrode 17. Meanwhile, the first pad electrode 17 may be disposed on a surface of the first semiconductor layer 12 without forming the step surface separated (electrical insulation) from the light emitting layer 13.

The first pad electrode 17 is in contact with the first semiconductor layer 12 with a low resistance. Hereinafter, in the specification, a state that a semiconductor material is in contact with an electrode material with a low resistance within a driving voltage of the semiconductor light emitting element 10 is referred to as "ohmic contact" (Therefore, the first pad electrode 17 is in contact with the first semiconductor layer 12 with ohmic contact). On the other hand, a state of a contact with a resistance higher than the ohmic contact is referred to as "Schottky contact". There is such a difference of resistance between the ohmic contact and the Schottky contact that when a current flows through the ohmic contact, substantially, no current flows through the Schottky contact in the structure where an ohmic contact and a Schottky contact are formed in parallel.

From the foregoing point of view, as a material of the first pad electrode 17, Ti, Al, Cr, Mo, W, Ag, and ITO which have a low contact resistance with the first semiconductor layer 12, or alloys containing at least one of these metals are preferably used for a layer in contact with the first semiconductor 12. The layer may be a single layer or a multilayer. Especially, a multilayer such as Ti/Rh/Au, Ti/Pt/Au, Ti/Ir/Au, Ti/Ru/Au, or Al—Si—Cu alloy/W/Au is preferably used because the first pad electrode 17 and the second pad electrode 18 can be formed concurrently. As the multilayer, specifically, the multilayer of Ti/Rh/Au each having a thickness of 2 nm/200 nm/500 nm may be used.

[Insulator Layer]

The insulator layer 15 has a function to reduce a light absorption by the second pad electrode 18 by reflecting the light emitted from the light emitting layer 13. Therefore, as a material of the insulator layer 15, the material having a refractive index smaller than that of the second semiconductor layer 14, for example, $SiO_2$, $Al_2O_3$, SiN, $MgF_2$, $CaF_2$, LiF, $AlF_3$, $BaF_2$, $YF_3$, $LaF_3$, $CeF_3$, $Y_2O_3$, $ZrO_2$, and $Ta_2O_5$ may be used.

In addition, the insulator layer 15 has a function to homogenize a current flowing in the second semiconductor layer 14. Namely, if the insulator layer 15 is not disposed, a current from the second pad electrode 18 concentrates in an area of the transparent electrode layer 16 located just below the second pad electrode 18. As a result, the current in the second semiconductor layer 14 becomes inhomogeneous, and accordingly, the luminous efficiency may be decreased due to insufficient utilization of area of the light emitting layer 13. However, by disposing the insulator layer 15, the area located just below the second pad electrode 18 can be prevented from generating the current concentration and the lowering of the luminous efficiency can be suppressed.

A thickness of the insulator layer 15 is preferably set to 10-750 nm. If the thickness is less than 10 nm, it is difficult to suppress the current concentration effectively. On the other hand, if the thickness is more than 750 nm, when the transparent electrode 16 is formed, a thickness of the transparent electrode layer 16 in the vicinity of a side face of the insulator 15 becomes thin due to the thick insulator layer 15. If the thin portion is formed once in the film of the transparent electrode layer 16 as described above, an open failure is likely to be caused in the thin portion due to a concentrated current from the second pad electrode 18. The thickness of the insulator layer 15 is, more preferably, set to 250-600 nm.

The insulator layer 15 is provided with a hole portion 19. With respect to a role of the hole portion 19 and a shape setting condition thereof, explanations will be given later together with the explanation of a function of a contact surface between the second pad electrode 18 and the second semiconductor layer 14.

[Transparent Electrode Layer]

The transparent electrode layer 16 is formed to cover an upper surface of the insulator layer 15 except for the hole portion 19 of the insulator layer 15, and substantially a whole area of an upper surface of the second semiconductor layer 14, where the insulator layer 15 is not formed. The transparent electrode 16 has a role to electrically connect the second pad electrode 18 and the second semiconductor layer 14 and to supply a current to the second semiconductor layer 14. In the normal use condition (condition of no disconnection in the transparent electrode layer 16) of the semiconductor light emitting element 10, the transparent electrode layer 16 forms an ohmic contact with the second semiconductor layer 14 so that a current flows between the second pad electrode 18 and the second semiconductor layer 14 through the transparent electrode 16.

In addition, the transparent electrode layer 16 has a role to radiate a light emitted from the light emitting layer 13 to outside through thereof. Therefore, especially, a material which has a large light transmission rate in the wavelength range of a light emitted from the light emitting layer 13 is preferably used for the transparent electrode layer 16. For example, oxides containing at least one selected from In, Zn, Sn, Ga, W and Ti, specifically, ITO, IZO, ZnO, $In_2O_3$, $SnO_2$ and $TiO_2$, and composite oxides thereof are used for the transparent electrode layer 16. Meanwhile, as the transparent electrode layer 16, a Ni/Au stack film may also be used.

A thickness of the transparent electrode layer 16 is preferably set to 20-400 nm for enabling the light emitting layer 13 to emit a light homogeneously in a large area by a current flowing homogeneously in the second semiconductor layer 14 except for the area just below the insulator layer 15, and for suppressing absorption of light emitted from the light emitting layer 13 by the transparent electrode layer 16.

Figure 8A:
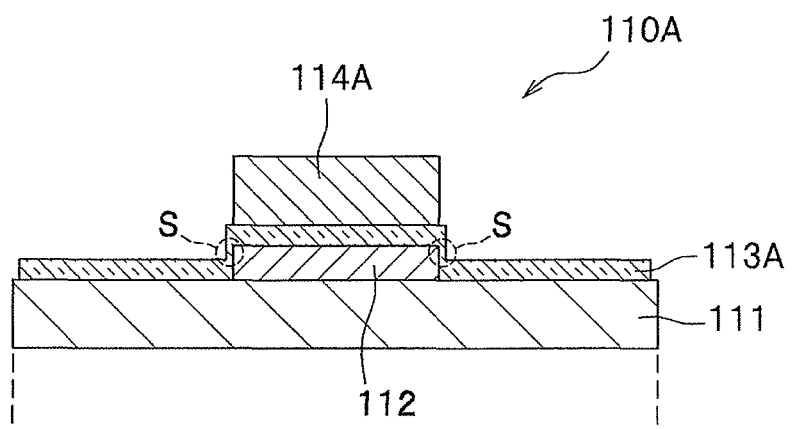
FIG. 8A is a cross sectional view showing an example of a structure of a conventional semiconductor light emitting element.
Figure 8B:
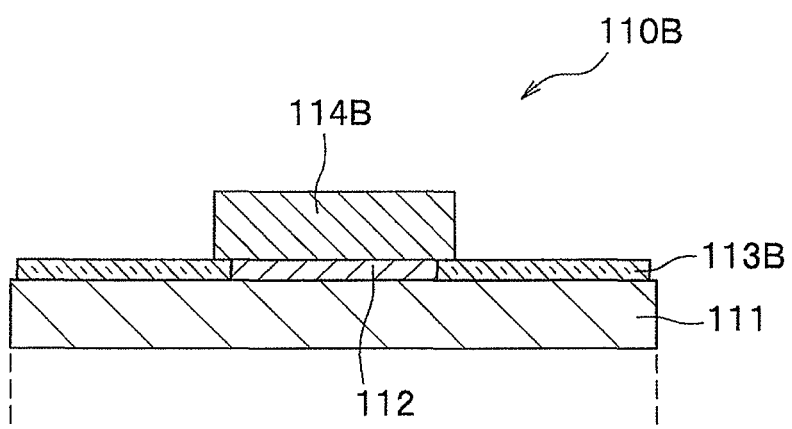
FIG. 8B is a cross sectional view showing an another example of a structure of a conventional semiconductor light emitting element

It is noted that a film thickness of the transparent electrode layer 16 in the vicinity of a side face of the insulator layer 15 is formed to be thin in comparison with that of an upper portion of the second semiconductor layer 14 and that of an upper portion of the insulator layer 15. This is caused by a film thickness of the insulator layer 15 and a film forming method (this will be described later) of the transparent electrode layer 16. In this sense, the structure has a similar structure to that shown in FIG. 8A, which was explained as the prior art.

[Second Pad Electrode]

The second pad electrode 18 has a role as a terminal to electrically connect a predetermined power source and the transparent electrode layer 16 and a role as a terminal to connect a plurality of the semiconductor light emitting elements 10 in series or in parallel. In order to prevent a light generated in the light emitting layer 13 from being absorbed by the second pad electrode 18, the second pad electrode 18 is disposed on a surface of the transparent electrode layer 16 above the insulator layer 15 so that the outer periphery of the second pad electrode 18 is located inside the outer periphery of the insulator layer 15, or overlap with the outer periphery of the insulator layer 15.

The second pad electrode 18 is in contact with the second semiconductor layer 14 through the hole portion 19 of the insulator layer 15. Here, a contact resistance between the second pad electrode 18 and the second semiconductor layer 14 is larger than that between the second pad electrode 18 and the second semiconductor layer 14 through the transparent electrode layer 16. Namely, the second pad electrode 18 forms a Schottky contact with the second semiconductor layer 14. Therefore, in the normal use condition, as described above, a current flows from the second pad electrode 18 to the second semiconductor layer 14 through the transparent electrode layer 16, however, the current does not flow directly from the second pad electrode 18 to the second semiconductor layer 14 through the hole portion 19 of the insulator layer 15.

It is preferable that the second pad electrode 18 has a single layer structure or a multilayer structure including a layer which is in contact with the second semiconductor layer 14 and made of Ti, W, Nb, Al, Sn, Si, Hf, Y, Fe, Zr, V, Mn, Gd, Ir, Pt, Ru, Ta or Cr that is a material having a large contact resistance with the second semiconductor layer 14, or made of alloys containing at least one of these metals. Especially, if Ti is used in a portion in contact with the second semiconductor layer 14, Ti forms a Schottky contact with a p-type semiconductor that is used for the second semiconductor layer 14, while Ti forms an ohmic contact with an n-type semiconductor that is used for the first semiconductor layer 12 and with various kinds of oxides that are used for the transparent electrode layer 16. Therefore, it is preferable to form the first pad electrode 17 and the second pad electrode 18 concurrently. Accordingly, a multilayer structure such as Ti/Rh/Au, Ti/Pt/Au, Ti/Ir/Au, Ti/Ru/Au and Al—Si—Cu alloy/W/Pt/Au are preferably used.

[Function of Schottky Contact Between Second Pad Electrode and Second Semiconductor Layer]

As described above, a film thickness of the transparent electrode layer 16 is thin in the vicinity of a side face of the insulator layer 15. Then, a disconnection may occur due to, for example, a current concentration at the thin portion. If the disconnection occurs in the transparent electrode layer 16, a current does not flow from the second pad electrode 18 to the second semiconductor layer 14 through the transparent electrode layer 16. However, in the light emitting device 10, if the disconnection occurs in the transparent electrode layer 16, a current flows from the second pad electrode 18 to the second semiconductor layer 14 through a Schottky contact surface (hereinafter, simply referred to as Schottky contact) between the second pad electrode 18 and the second semiconductor layer 14. Due to the current at this time, an overvoltage breakdown is caused in the first semiconductor layer 12/light emitting layer 13/second semiconductor layer 14 to form a short circuit, thereby resulting in securing a current path. Therefore, for example, in a light emitting apparatus that connects a plurality of the semiconductor light emitting elements 10 in series, a current path is secured although the semiconductor light emitting element that is disconnected in the transparent electrode layer 16 does not emit a light. As a result, current supplies to the other semiconductor light emitting elements do not stop, and light emissions of the other semiconductor light emitting elements can be maintained.

A planer shape of the hole portion 19 disposed in the insulator layer 15 is identical to a shape of the Schottky contact. By forming the shape in circular or ellipsoidal, if a disconnection occurs in the transparent electrode layer 16, a distribution of a current passing through the Schottky contact is likely to be homogeneous, and a current pass directed from the Schottky contact to the first pad electrode 17 can be surely formed when an overvoltage breakdown is caused in the first semiconductor layer 12/light emitting layer 13/second semiconductor layer 14.

An area of the Schottky contact is identical to an opening area of the hole portion 19 of the insulator layer 15, and it is preferable that the opening area of the hole portion 19 is not more than 80% of a contact area between the insulator layer 15 and the second semiconductor layer 14. This is because when the semiconductor light emitting element 10 is normally used, the second pad electrode 18 absorbs a light emitted in the light emitting layer 13 through the Schottky contact. Then, by forming the area of the Schottky contact to be small, the light absorption by the second pad electrode 18 can be made small.

It is preferable that an average diameter of the hole portion 19 of the insulator layer 15 is not less than 16 μm. Here, the average diameter means that if the planer shape (that is, the shape of the Schottky contact) of the hole portion 19 is not circular, for example, if the shape is ellipsoidal, the average diameter is an average length of the major axis and the minor axis, and if the shape is square, the average diameter is a diameter of a circle having the same area with the square. As shown in the embodiment described later, if the average diameter of the hole portion 19 is not less than 16 μm, when an open failure occurs in the transparent electrode layer 16, a current path can be surely formed by causing an overvoltage breakdown in the first semiconductor layer 12/light emitting layer 13/second semiconductor layer 14 by the current passing through the Schottky contact.

Meanwhile, a bonding wire is bonded to the second pad electrode 18 in order to connect the second pad electrode 18 to a power source or another semiconductor light emitting element 10. The boding wire is preferably bonded to the upper center (an area above the hole portion 19 of the insulator 15) of the second pad electrode 18. Then, a current flowing in the second pad electrode 18 can be made homogeneous, and if a disconnection occurs in the transparent electrode layer 16, a current tends to flow toward the Schottky contact just below the upper center of the second pad electrode 18. Therefore, it is likely to cause an overvoltage breakdown in the first semiconductor layer 12/light emitting layer 13/second semiconductor layer 14, and likely to form a current path.

[Light Emitting Apparatus]

Figure 2B:
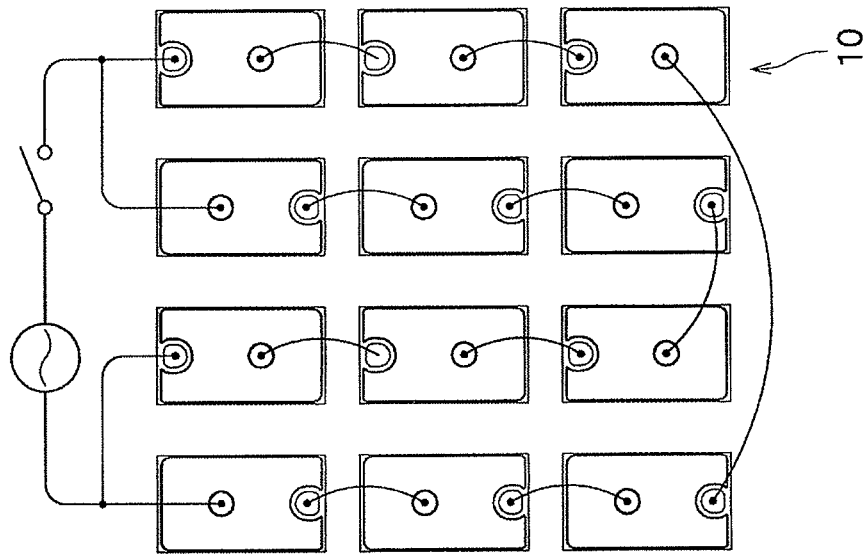
FIG. 2B is a schematic illustration showing a brief structure of a light emitting apparatus constituted by using a semiconductor light emitting element shown in FIG. 1A to FIG. 1C, which is an example of a connecting structure using an alternate current power source.
Figure 2A:
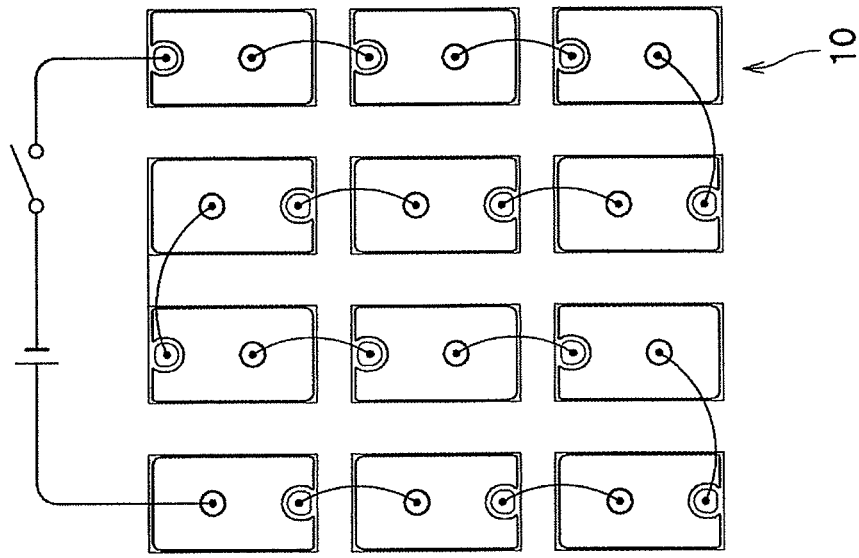
FIG. 2A is a schematic illustration showing a brief structure of a light emitting apparatus constituted by using a semiconductor light emitting element shown in FIG. 1A to FIG. 1C, which is an example of a connecting structure using a direct current power source.

In FIG. 2A and FIG. 2B, a schematic illustration showing a brief configuration (that is, a connecting structure of semiconductor light emitting elements) of a light emitting apparatus using a semiconductor light emitting element according to the foregoing first embodiment is shown. Here, an example of a connecting structure that uses a direct current is shown in FIG. 2A, and an example of a connecting structure that uses an alternative current is shown in FIG. 2B. Meanwhile, since a structure of the semiconductor light emitting element 10 constituting each of the light emitting apparatuses shown in FIG. 2A and FIG. 2B is obvious from FIG. 1A to FIG. 1C, explanations on elements of the semiconductor light emitting element 10 are omitted in FIG. 2A and FIG. 2B.

The light emitting apparatus shown in FIG. 2A has a structure that connects a plurality (12 pieces are exemplified in FIG. 2A) of the semiconductor light emitting elements 10 in series in a line by bonding wires, and the semiconductor light emitting elements 10 can be turned on simultaneously using a direct current power source. The light emitting apparatus shown in FIG. 2B has a structure that connects two line units, each consisting of a plurality (6 pieces in FIG. 2B) of the semiconductor light emitting elements 10 connected in series in a line by bonding wires, in parallel against an alternative current power source, and currents flowing in the two line units have opposite directions to each other (when a current flows in one line unit, no current flows in the other line unit). Namely, the light emitting apparatus shown in FIG. 2B has a structure where the semiconductor light emitting elements 10 in each of the line units alternately emit lights by line unit, depending on a frequency of the alternative current output from the alternative current power source.

In these light emitting apparatuses, even if a disconnection (breakdown) is generated in the transparent electrode layer 16 of one semiconductor light emitting element 10, the semiconductor light emitting element 10 is prevented from generating an open failure since a current path passing through the foregoing Schottky contact and the first semiconductor layer 12/light emitting layer 13/second semiconductor layer 14 is formed between the second pad electrode 18 and the first pad electrode 17. Then, even if one semiconductor light emitting element 10 becomes unable to emit a light, the remaining eleven semiconductor light emitting elements 10 can maintain the condition capable of emitting a light. Meanwhile, in FIG. 2A and FIG. 2B, for example, the twelve semiconductor light emitting elements 10 may be disposed on a single substrate. In addition, a plurality of the light emitting apparatus, shown in FIG. 2A and FIG. 2B, consisting of the twelve semiconductor light emitting elements 10 may be further connected in series in order to form another new light emitting apparatus.

[Fabrication Method of Semiconductor Light Emitting Element]

The fabrication method of the semiconductor light emitting element 10 is briefly described by the following steps.

(1) Formation of the first semiconductor layer 12, the light emitting layer 13 and the second semiconductor layer 14 on a substrate surface.

(2) Formation of the insulator layer 15 and the transparent electrode layer 16.

(3) Etching a part of area in order to form the first pad electrode 17.

(4) Formation of the first pad electrode 17 and the second pad electrode 18.

Explanations of the steps (1) to (4) will be given below.

[Formation of First Semiconductor Layer, Light Emitting Layer, and Second Semiconductor Layer]

The first semiconductor layer, the light emitting layer, and the second semiconductor layer can be formed by growing a semiconductor (compound semiconductor) on a surface of a cleaned substrate 11 using a gas containing, for example, a predetermined semiconductor material and dopants with various kinds of vapor phase epitaxy such as MOVPE (metal-organic vapor phase epitaxy), HDVPE (halide vapor phase epitaxy), MBE (molecular beam epitaxy), and MOMBE (metal-organic molecular beam epitaxy). In this case, according to a composition of the semiconductor layer (first semiconductor layer 12 consisting of n-type semiconductor/light emitting layer 13/second semiconductor layer 14 consisting of p-type semiconductor) to be formed, a gas species is changed and a growth time is adjusted depending on a film thickness of each of the semiconductor layers, and as a result, these semiconductor layers can be formed continuously.

[Formation of Insulator Layer and Transparent Electrode Layer]

The insulator layer 15 having a planar ring shape is formed on a part of a surface of the second semiconductor layer 14. For example, the insulator layer 15 may be formed by growing a material composing the insulator layer 15 on a predetermined area by sputtering and the like using a photomask, and removing the photomask thereafter.

The transparent electrode layer 16 may be formed by growing a conductive oxide containing at least one selected from In, Zn, Sn, and Ga on a whole surface of the insulator layer 15, for example, after the insulator layer 15 is formed, and subsequently conducting etching on the area (that is, the area of the hole portion 19 and its vicinity of the insulator layer 15 and the area for forming the first pad electrode 17) that the transparent electrode layer 16 is unnecessary.

[Partial Etching for Forming First Pad Electrode 17]

An etching mask is formed except for an area for forming the first pad electrode 17, etching is conducted until a mid depth of the first semiconductor layer 12 by, for example, dry etching, and after that, the etching mask is removed. Thus, the area for disposing the first pad electrode 17 can be formed.

[Formation of First Pad Electrode and Second Pad Electrode]

The first pad electrode 17 and the second pad electrode 18 may be formed concurrently in such a manner that, for example, a resist pattern is formed so that areas for forming the first pad electrode 17 and the second pad electrode 18 are exposed, then, Ti/Rh/Au are grown sequentially by using, for example, spattering. After that, the resist pattern is removed. It is noted that the fabrication method of the semiconductor light emitting element 10 is not limited to the foregoing processes. For example, the following processes may be applied to the fabrication method. After the first semiconductor layer 12/light emitting layer 13/second semiconductor layer 14 are formed, an area for forming the first pad electrode 17 is formed by etching. Then, the first pad electrode 17 is formed, and subsequently, the insulator layer 15, the transparent electrode layer 16 and the second pad electrode 18 are formed sequentially.

Second Embodiment

Figure 3:
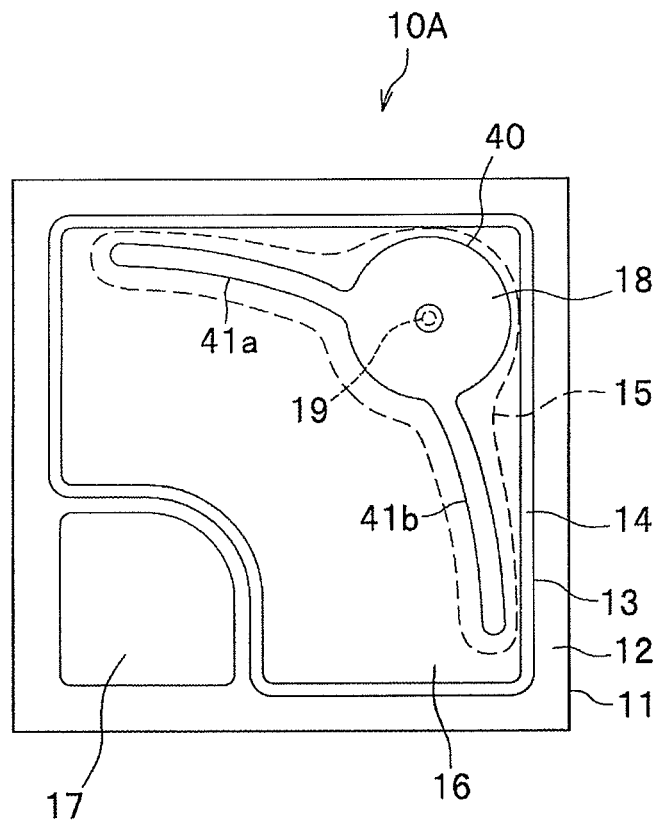
FIG. 3 is a top view showing a brief structure of a semiconductor light emitting element according to a second embodiment of the present invention.

FIG. 3 is a top view showing a brief structure of a semiconductor light emitting element according to a second embodiment of the present invention. An element of a semiconductor light emitting element 10A shown in FIG. 3 and having a function identical to that of the semiconductor light emitting element 10 shown in FIG. 1A to FIG. 1C has the same reference number with that of the semiconductor light emitting element 10 in the drawings and the explanation. This is the same with semiconductor light emitting elements according to a third embodiment and a fourth embodiment, which will be described later.

FIG. 3 is drawn in a similar manner to FIG. 1A, and the semiconductor light emitting element 10A has a shape of substantially square in plan view and includes the substrate 11, the first semiconductor layer 12 (overlapped with the substrate 11) formed on the substrate 11, the first pad electrode 17 disposed at a corner portion on the first semiconductor layer 12, the light emitting layer 13 disposed on the first semiconductor layer 12 separated from the first pad electrode 17, the second semiconductor layer 14 (overlapped with the light emitting layer 13) disposed on the light emitting layer 13, and the insulator layer 15 disposed on the second semiconductor layer 14.

The insulator layer 15 is disposed on a part of an upper surface of the second semiconductor layer 14 and includes a nearly circular core portion disposed at a corner portion which is located diagonally to the corner portion where the first pad electrode 17 is disposed and an extending portion extending along a side direction of the second semiconductor layer 14 from the core portion. The foregoing shape of the insulator layer 15 is formed corresponding to a shape of the second pad electrode 18. The hole portion 19 passing through in the thickness direction is disposed near the center of the core portion.

In addition, the semiconductor light emitting element 10A includes the transparent electrode layer 16, which covers an upper surface of the insulator layer 15 without covering the hole portion 19 of the insulator layer 15 as well as an area where the insulator layer 15 is not formed on the second semiconductor layer 14, and the second pad electrode 18 which is in contact with the second semiconductor layer 14 through the hole portion 19 of the insulator layer 15 and located at a position facing the insulator layer 15 across the transparent electrode layer 16 so as to come in contact with the transparent electrode layer 16.

In the plan view shown in FIG. 3, the second pad electrode 18 has a size to fall inside the insulator layer 15. The second pad electrode 18 includes a core portion 40 disposed on the core portion of the insulator layer 15 and extending portions 41a, 41b disposed on respective extending portions of the insulator layer 15. By disposing the extending portions 41a, 41b as described above, a current in a whole surface of the second semiconductor layer 14 can be made homogeneous. As a result, a light emission that effectively utilizes a light emitting area of the light emitting layer 13 becomes possible. In addition, by adjusting a shape of the insulator layer 15 to that of the second pad electrode 18, a generation of current concentration just below the second pad electrode 18 can be avoided.

Meanwhile, with respect to a current flow to the second semiconductor layer 14 from the second pad electrode 18 in the case that the second pad electrode 18 is provided with the extending portions 41a, 41b, it is thought that a current flow (current density) to the second semiconductor layer 14 from the core portion 40 is larger than a current flow to the second semiconductor layer 14 from the extending portions 41a, 41b. Therefore, a structure which is provided with the insulator layer 15 only just below the core portion 40 of the second pad electrode 18 may be adopted.

The transparent electrode 16 forms an ohmic contact with the second semiconductor layer 14, and the second pad electrode 18 forms a Schottky contact with the second semiconductor layer 14. Namely, although a planar structure of the semiconductor light emitting element 10A is different from that of the semiconductor light emitting element 10 in FIG. 1A to FIG. 1C, as described above, a cross sectional structure of the semiconductor light emitting element 10A is identical to that of the semiconductor light emitting element 10 in FIG. 1A to FIG. 1C described above. Therefore, if the transparent electrode layer 16 is disconnected, a current flows through the Schottky contact between the second pad electrode 18 and the second semiconductor layer 14 while securing a current path, and as a result, the semiconductor light emitting element 10A can be prevented from generating an open failure.

Third Embodiment

Figure 4:
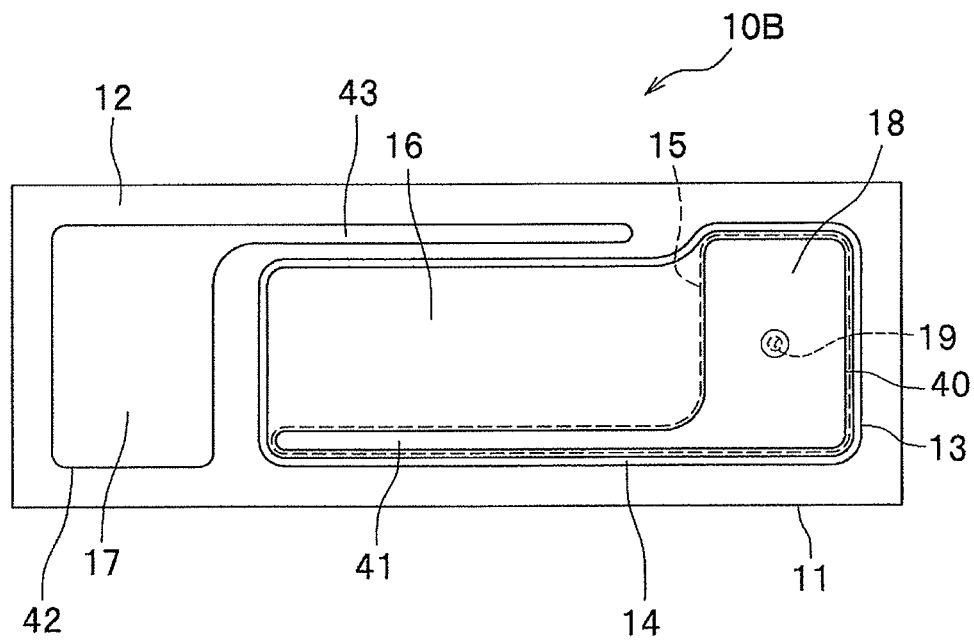
FIG. 4 is a top view showing a brief structure of a semiconductor light emitting element according to a third embodiment of the present invention.

A top view showing a brief structure of a semiconductor light emitting element according to a third embodiment of the present invention is shown in FIG. 4. FIG. 4 is drawn in a similar manner to FIG. 1A, and a semiconductor light emitting element 10B has a shape of substantially square and includes the substrate 11, the first semiconductor layer 12 (overlapped with the substrate 11) formed on the substrate 11, and the first pad electrode 17 disposed on one end of the first semiconductor layer 12 in the longitudinal direction of the first semiconductor layer 12. The first pad electrode 17 includes a core portion 42 disposed at an end on the first semiconductor layer 12 in the longitudinal direction of the first semiconductor layer 12 and an extending portion 43 extending form the core portion 42 along a long side of the first semiconductor layer 12.

In addition, the semiconductor light emitting element 10B includes the light emitting layer 13 disposed on the first semiconductor layer 12 separated from the first pad electrode 17, the second semiconductor layer 14 (overlapped with the light emitting layer 13) formed on the light emitting layer 13, and the insulator layer 15 formed on the second semiconductor layer 14. The insulator layer 15 includes a core portion disposed on the second semiconductor layer 14 at an end in the longitudinal direction opposite to the first pad electrode 17 and an extending portion extending from the core portion along the long side. The foregoing shape of the insulator layer 15 is formed corresponding to a shape of the second pad electrode 18. In addition, the hole portion 19 passing through in the thickness direction is disposed near the center of the core portion.

In addition, the semiconductor light emitting element 10B includes the transparent electrode layer 16, which covers an upper surface of the insulator layer 15 without covering the hole portion 19 of the insulator layer 15 and an area where the insulator layer 15 is not formed on the second semiconductor layer 14, and the second pad electrode 18 which is in contact with the second semiconductor layer 14 through the hole portion 19 of the insulator layer 15 and located at a position facing the insulator layer 15 across the transparent electrode layer 16 so as to come in contact with the transparent electrode layer 16.

In the plan view shown in FIG. 4, the second pad electrode 18 has a size to fall inside the insulator layer 15. The second pad electrode 18 includes the core portion 40 disposed on the core portion of the insulator layer 15 and an extending portion 41 disposed on the extending portion of the insulator layer 15. By disposing the extending portion 41 in the second pad electrode 18 as well as disposing the extending portion 43 in the first pad electrode 17, a current in a whole surface of each of the first semiconductor layer 12 and the second semiconductor layer 14 can be made homogeneous. As a result, a light emission that effectively utilizes alight emitting area of the light emitting layer 13 becomes possible. In addition, by adjusting a shape of the insulator layer 15 to that of the second pad electrode 18, a generation of current concentration just below the second pad electrode 18 can be avoided. It is noted that even if the second pad electrode 18 includes the extending portion 41, the insulator layer 15 may be disposed only just below the core portion 40.

The transparent electrode 16 forms an ohmic contact with the second semiconductor layer 14, and the second pad electrode 18 forms a Schottky contact with the second semiconductor layer 14. Namely, although a planar structure of the semiconductor light emitting element 10B is different from that of the semiconductor light emitting element 10 in FIG. 1A to FIG. 1C as described above, a cross sectional structure of the semiconductor light emitting element 10B is identical to that of the foregoing semiconductor light emitting element 10 in FIG. 1A to FIG. 1C. Therefore, when the transparent electrode layer 16 is disconnected, a current flows through the Schottky contact between the second pad electrode 18 and the second semiconductor layer 14 while securing a current path, and as a result, the semiconductor light emitting element 10B can be prevented from generating an open failure.

Fourth Embodiment

Figure 5:
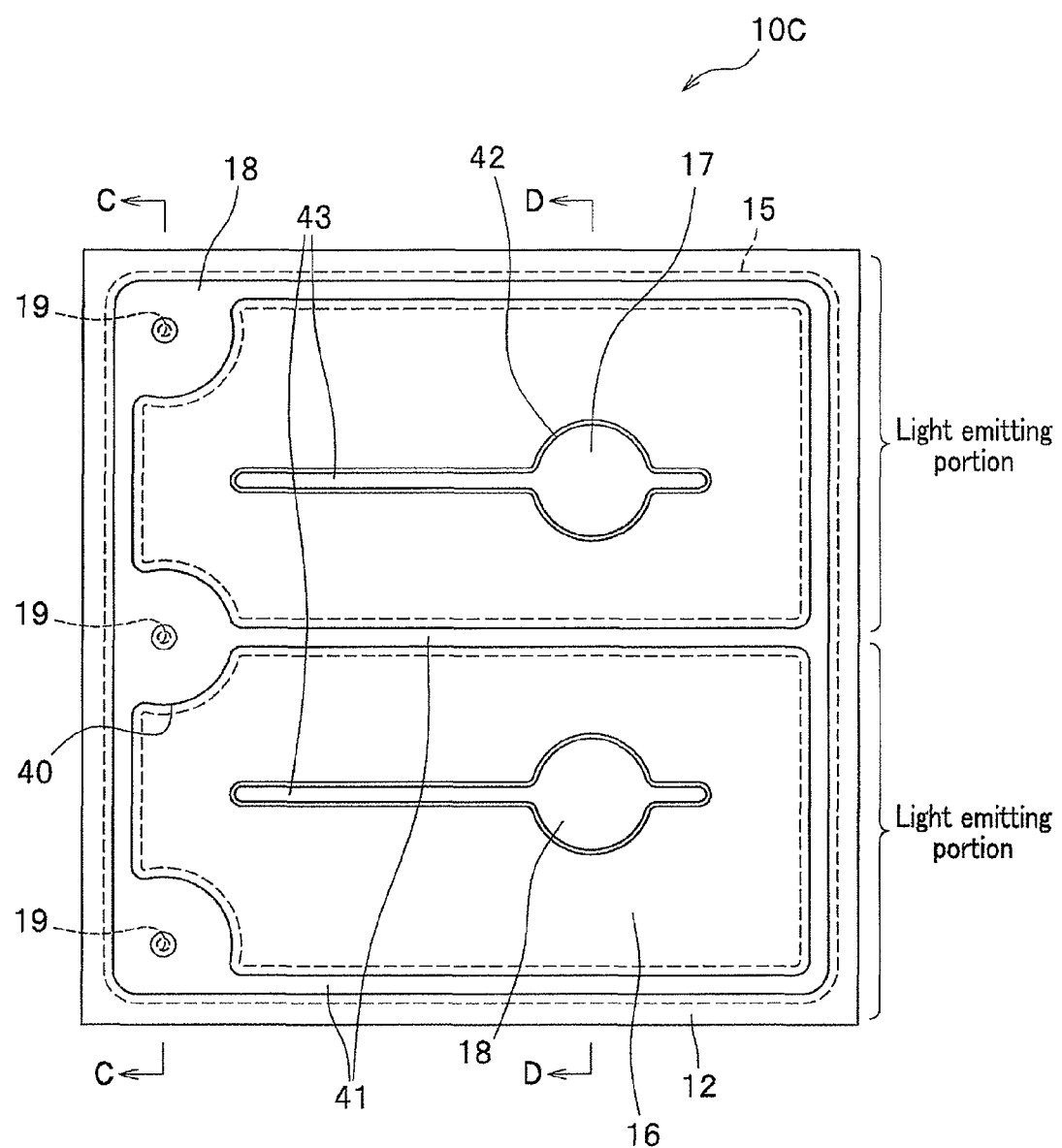
FIG. 5 is a top view showing a brief structure of a semiconductor light emitting element according to a fourth embodiment of the present invention.
Figure 6A:
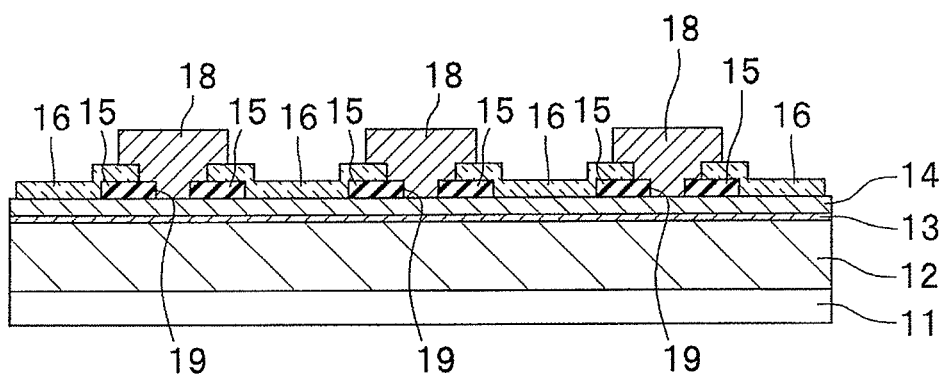
FIG. 6A is a cross sectional view showing a brief structure of a semiconductor light emitting element according to the fourth embodiment taken along C-C line of FIG. 5.
Figure 6B:
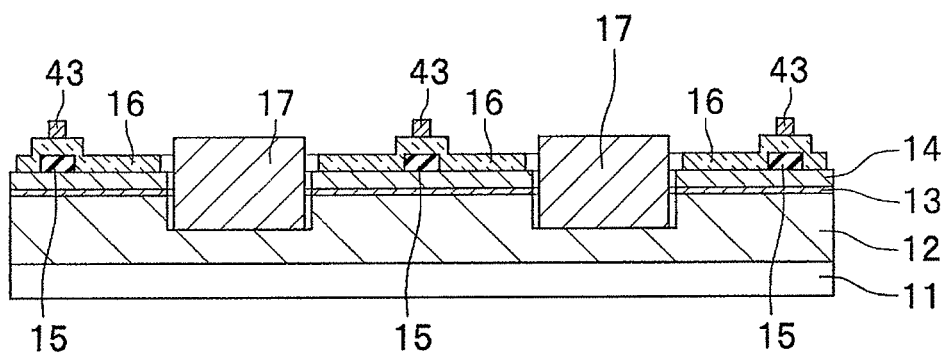
FIG. 6B is a cross sectional view showing a brief structure of the semiconductor light emitting element according to the fourth embodiment taken along D-D line of FIG. 5.

A top view showing a brief structure of a semiconductor light emitting element according to a fourth embodiment of the present invention is shown in FIG. 5. FIG. 6A is a cross sectional view of the semiconductor light emitting element taken along C-C line of FIG. 5, and FIG. 6B is a cross sectional view of the semiconductor light emitting element taken along D-D line of FIG. 5. The semiconductor light emitting element 10C has a structure provided with two light emitting portions connected in parallel. The semiconductor light emitting element 10C includes the substrate 11 and the first semiconductor layer 12 formed on the substrate 11, and areas of the respective light emitting portions are allocated on the common first semiconductor layer 12.

The each light emitting portion is provided with the first pad electrode 17 formed on the first semiconductor layer 12, and the first pad electrode 17 includes a core portion 42 having a nearly circular shape in plan view and an extending portion 43 extending through the core portion 42 in the radial direction. The light emitting layer 13 is formed on the first semiconductor layer 12 so as to separate from the first pad electrode 17, and the second semiconductor layer 14 is disposed on the light emitting layer 13. As shown in FIG. 6A, the light emitting layer 13 is common to the two light emitting portions and the second semiconductor layer 14 is also common to the two light emitting portions. Namely, areas of respective light emitting portions are allocated to the common light emitting layer 13 and to the common second semiconductor layer 14.

The semiconductor light emitting element 10C has such a structure that the second pad electrode 18 surrounds a periphery of the first pad electrode 17, and the second pad electrodes 18 provided in respective light emitting portions are connected to each other. The second pad electrode 18 includes core portions 40 disposed at two corner portions on the short side of respective light emitting portions and extending portions 41 extending from the core portion 40 along the long side. The insulator layer 15 is formed on the second semiconductor layer 14 corresponding to a shape of the second pad electrode 18, and a shape of the insulator layer 15 is designed so that the second pad electrode 18 is fallen inside the insulator layer 15 in plan view shown in FIG. 5.

The semiconductor light emitting element 10C includes the insulator layer 15, the transparent electrode layer 16, the first pad electrode 17 and the second pad electrode 18. The first pad electrode 17 includes the core portion 42 and the extending portion 43, the second pad electrode 18 includes the core portion 40 and the extending portion 41, and the insulator layer 15 has a shape corresponding to that of the second pad electrode 18 so that the second pad electrode 18 is fallen inside the insulator layer 15 in plan view shown in FIG. 5. The hole portion 19 passing through in the thickness direction is disposed in an area lower than the core portion 40 in the second pad electrode 18 and the insulator layer 15.

The each light emitting portion includes the transparent electrode layer 16 which covers an upper surface of the insulator layer 15 without covering the hole portion 19 of the insulator layer 15 and an area where the insulator layer 15 is not formed on the second semiconductor layer 14. The second pad electrode 18 having the foregoing shape is, as shown in FIG. 6A, disposed in such a manner that the second pad electrode 18 is in contact with the second semiconductor layer 14 through the hole portion 19 of the insulator layer 15 and located at a position facing the insulator layer 15 across the transparent electrode layer 16 so as to come in contact with the transparent electrode layer 16.

By disposing the extending portions 41 in the second pad electrode 18 as well as disposing the extending portion 43 in the first pad electrode 17, a current in a whole surface of each of the first semiconductor layer 12 and the second semiconductor layer 14 can be made homogeneous. As a result, a light emission that effectively utilizes a light emitting area of the light emitting layer 13 becomes possible. In addition, by adjusting a shape of the insulator layer 15 to that of the second pad electrode 18, a generation of current concentration just below the second pad electrode 18 can be avoided. It is noted that even if the second pad electrode 18 includes the extending portion 41, the insulator layer 15 may be disposed only just below the core portion 40.

The transparent electrode 16 forms an ohmic contact with the second semiconductor layer 14, and the second pad electrode 18 forms a Schottky contact with the second semiconductor layer 14. Therefore, if the transparent electrode layer 16 is disconnected, a current flows through the Schottky contact between the second pad electrode 18 and the second semiconductor layer 14 while securing a current path, and as a result, the semiconductor light emitting element 10C can be prevented from generating an open failure.

Explanations for the semiconductor light emitting elements 10, 10A, 10B and 10C according to the embodiments 1 to 4 of the present invention have been made. However, the present invention is not limited to these embodiments and, for example, a shape of the light emitting device in plan view may be oval, parallelogram or polygonal, other than square or oblong (rectangle). In addition, in the first to fourth embodiments, the first pad electrode is formed on a side identical to the side of the second pad electrode as seen from the substrate. However, the arrangements of the first pad electrode and the second pad electrode are not limited to this, and a structure having no substrate or having a conductive substrate may be adopted and, for example, the first pad electrode on the first semiconductor layer may be disposed on a side opposite to the semiconductor light emitting element across the semiconductor layers and the second pad electrode.

EXAMPLES

As a semiconductor light emitting element of EXAMPLE 1, a semiconductor light emitting element having a structure shown in FIG. 1 was fabricated. The semiconductor light emitting element of EXAMPLE 1 was fabricated by the following processes. A first semiconductor layer made of a GaN-based n-type semiconductor, a light emitting layer made of a GaN-based undoped semiconductor and a second semiconductor layer made of a GaN-based p-type semiconductor were sequentially formed on a sapphire substrate by MOCVD. After that, etching was conducted in order to form an area (see FIG. 1A) for disposing a first pad electrode, and a part of the first semiconductor layer was exposed. Meanwhile, in order to concurrently fabricate a plurality of semiconductor light emitting elements of EXAMPLE 1, the first semiconductor layer/light emitting layer/second semiconductor layer were formed on the sapphire substrate.

Here, the first semiconductor layer had the following structure. A buffer layer (film thickness: about 10 nm) made of AlGaN was grown on the sapphire substrate. Subsequently, an undoped GaN layer (1 μm), an n-side contact layer (5 μm) made of GaN containing $4.5 \times 10^{18}/cm^3$ of Si, an n-side first multilayer (total thickness: 335 nm) consisting of three layers of a bottom layer (300 nm) made of undoped GaN, an interlayer (30 nm) made of GaN containing $4.5 \times 10^{18}/cm^3$ of Si and an upper layer (5 μm) made of undoped GaN, and an n-side second multilayer (total thickness: 64 nm) that is a superlattice structure where an undoped GaN layer (4 nm) and an undoped $In_{0.1}Ga_{0.9}N$ layer (2 nm) were alternately stacked ten times for each and further, an undoped GaN layer (4 nm) was stacked, were grown in this order on the buffer layer.

Next, the light emitting layer was formed of a multiquantum well structure (total thickness: 193 nm) consisting of a barrier layer (25 nm) made of undoped GaN and a layer which was formed by stacking a well layer (3 nm) made of $In_{0.3}Ga_{0.7}N$, a first barrier layer (10 nm) made of $In_{0.02}Ga_{0.98}N$ and a second barrier layer (15 nm) made of undoped GaN alternately six times for each layer.

In addition, the second semiconductor layer had a structure that sequentially stacked the p-side multilayer (total film thickness: 36.5 nm), which was formed of a superlattice structure formed by stacking a $Al_{0.15}Ga_{0.85}N$ layer (4 nm) containing $5 \times 10^{19}/cm^3$ of Mg and an $In_{0.03}Ga_{0.97}N$ layer (2.5 nm) containing $5 \times 10^{19}/cm^3$ of Mg alternately five times for each and further stacking another $Al_{0.15}Ga_{0.85}N$ layer (4 nm) containing $5 \times 10^{19}/cm^3$ of Mg, and a p-side contact layer (120 nm) made of GaN containing $1 \times 10^{20}/cm^3$ of Mg, in this order.

At a predetermined position (see FIG. 1A) on a surface of the second semiconductor layer that is a light emitting surface, an insulator layer made of $SiO_2$ having a flat ring shape which includes a hole portion having an inner diameter of 10 μm and has an outer diameter of 76 μm was grown 500 nm in thickness by sputtering. After that, a transparent electrode layer made of ITO provided with a hole portion having an inner diameter 6 μm larger (that is, inner diameter: 16 μm) than the diameter (hole diameter) of the hole portion of the insulator layer was grown 170 nm in thickness on the insulator layer and the second semiconductor layer.

In addition, the second pad electrode having a diameter of 70 μm was formed by spattering so as to directly contact with the second semiconductor layer through the hole portion of the insulator. A structure of the second pad electrode was a three-layered structure of Ti/Rh/Au, and thicknesses of the three layers were 1.5 nm/200 nm/500 nm, respectively. In addition, when the second pad electrode was formed, the first pad electrode was formed concurrently with the formation of the second pad electrode with a structure identical to that of the second pad electrode. Here, a shape of the first pad electrode in plan view was nearly circular having an average diameter of 70 μm. Meanwhile, the second pad electrode forms a Schottky contact with the second semiconductor layer (GaN-based p-type semiconductor), and the second pad electrode forms an ohmic contact with the transparent electrode (ITO). The first pad electrode forms an ohmic contact with the first semiconductor layer (GaN-based n-type semiconductor).

Next, a semiconductor light emitting element having a size of 500 μm×290 μm was cut out by dicing and bonded on a metal lead frame. Then, Au wire was bonded to each of the first pad electrode and the second pad electrode and the semiconductor light emitting element was molded with epoxy resin. According to the processes described above, the semiconductor light emitting element of EXAMPLE 1 was fabricated.

As a semiconductor light emitting element of EXAMPLE 2, a semiconductor light emitting element having a structure identical to that of the semiconductor light emitting element of EXAMPLE 1 except that a diameter of the hole portion of the insulator layer is 16 μm and that a diameter of the hole portion of the transparent electrode layer corresponding to the hole portion of the insulator layer is 22 μm was fabricated. Similarly, as semiconductor light emitting elements of EXAMPLES 3, 4, 5 and 6, semiconductor light emitting elements having structures identical to that of the semiconductor light emitting element of EXAMPLE 1 except that diameters of the hole portions of the insulator layers of EXAMPLES 3, 4, 5 and 6 are 22 μm, 28 μm, 34 μm and 40 μm, respectively and that diameters of the hole portions of the transparent electrode layers corresponding to the respective hole portions of the insulator layers are 28 μm, 34 μm, 40 μm and 46 μm, respectively were fabricated. In addition, as a semiconductor light emitting element of a COMPARATIVE EXAMPLE having a conventional structure, a semiconductor light emitting element (see FIG. 8A) which has no hole portion in the insulator layer, that is, which has no area that the second pad electrode is in direct contact with the second semiconductor layer, was fabricated.

A voltage to generate an open failure in the semiconductor light emitting elements of the COMPARATIVE EXAMPLE and EXAMPLES 1 to 6 was investigated by applying a voltage of machine model between the first pad electrode and the second pad electrode and investigating an electric conduction between the first pad electrode and the second pad electrode. Meanwhile, generally, the applying a voltage of machine model is to charge up a capacitor of 200 pF at an appropriate voltage and to apply the voltage to a device, and may be conducted using, for example, electrostatic breakdown test equipment (Model: DWP-3000) manufactured by DAITRON TECHNOLOGY CO., LTD.

Figure 7:
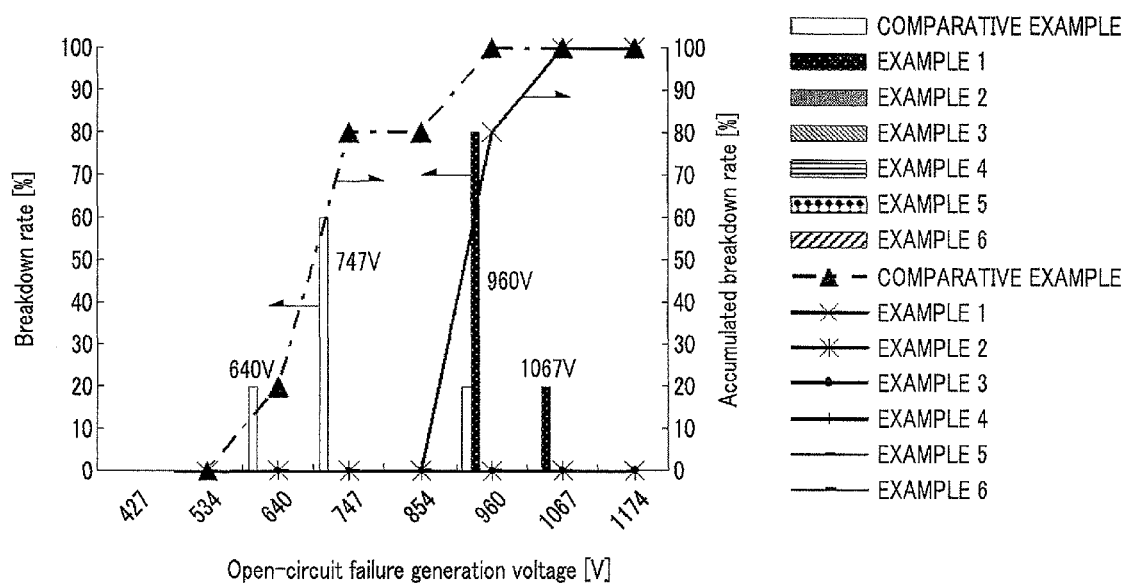
FIG. 7 is a graph showing relationships between an open-circuit failure generation voltage (applied voltage) and a breakdown rate as well as an accumulated breakdown rate.

A graph showing relations between an open-circuit failure generation voltage (applied voltage) and a breakdown rate as well as an accumulated breakdown rate is shown in FIG. 7. It is noted that in FIG. 7, the breakdown rate (a ratio of open failure samples to total samples) is indicated by bar charts, and the accumulated breakdown rate is indicated by line charts. In addition, a value of the open-circuit failure generation voltage on the horizontal axis corresponds to the line charts (accumulated breakdown voltage), and the bar charts (breakdown rate) are shown at positions shifted from the actual open-circuit failure generation voltages, while the actual open-circuit failure generation voltages are shown near the bar charts.

With respect to the semiconductor light emitting element of the COMPARATIVE EXAMPLE, the open failure generation was not observed at applied voltage of 534V (that is, the semiconductor light emitting element was capable of emitting a light). However, at applied voltage of 640V, the open failure was generated in the semiconductor light emitting elements at a rate of 20%. In addition, at applied voltage of 747V, the open failure was generated in the semiconductor light emitting elements at a rate of 60% (The accumulated breakdown rate is 80%), and at applied voltage of 960V, the open failure was generated in the remaining 20% of the semiconductor light emitting elements (The accumulated breakdown rate is 100%). It was proven that the open failure generation in the COMPARATIVE EXAMPLE was caused by a disconnection of the transparent electrode layer.

On the other hand, in the semiconductor light emitting element of EXAMPLE 1, the open failure generation was not observed at applied voltage of 534 to 854V. Comparing this result with that of the COMPARATIVE EXAMPLE, it was considered that although the transparent electrode layer was disconnected at the applied voltage at 80% of the samples, a current path was secured in the first semiconductor layer/light emitting layer/second semiconductor layer due to a current flow through the Schottky contact between the second pad electrode and the second semiconductor layer. In the semiconductor light emitting element of EXAMPLE 1, the open failure was generated at 80% of the semiconductor light emitting elements by applied voltage of 960V, and at applied voltage of 1096V, the open failure was generated in the remaining 20% of the semiconductor light emitting elements. This was considered that a breakdown was caused by an excess current in the hole portion between the second semiconductor layer and the second pad electrode due to a small diameter of the hole portion disposed in the insulator layer. From the above facts, it can be seen that the semiconductor light emitting element of EXAMPLE 1 has a structure that the open-circuit failure generation voltage is high and the open failure is hardly caused in comparison with the semiconductor light emitting element of the COMPARATIVE EXAMPLE.

The open failure was not observed in the semiconductor light emitting elements of EXAMPLES 2 to 6 even if 1174V was applied to the devices. Then, the bar charts indicating the breakdown rates of the semiconductor light emitting elements of EXAMPLES 2 to 6 are not shown in FIG. 7. This was considered that a current flowed through the Schottky contact between the second pad electrode and the second semiconductor layer and a current path in the first semiconductor layer/light emitting layer/second semiconductor layer was secured by enlarging a diameter of the hole portion disposed in the insulator layer larger than 16 μm, and thereby, the hole portion was also not broken by an excess current within the range of applied voltages of the present tests.

What is claimed is:

1. A semiconductor light emitting element, comprising:
   a first semiconductor layer;
   a light emitting layer disposed on the first semiconductor layer;
   a first pad electrode disposed on the first semiconductor layer so as to separate from the light emitting layer;
   a second semiconductor layer disposed on the light emitting layer;
   an insulator layer disposed on one part of the second semiconductor layer and having a hole portion passing through in a thickness direction of the second semiconductor layer;
   a transparent electrode layer disposed continuously from another part of the second semiconductor layer to a part of an upper surface of the insulator layer; and
   a second pad electrode disposed on the transparent electrode so as to be in contact with the second semiconductor layer through the hole portion of the insulator layer and in contact with the transparent electrode so that the transparent electrode is interposed between the second pad electrode and the insulator layer,
   wherein a contact resistance between the second pad electrode and the second semiconductor layer is larger than a contact resistance between the transparent electrode layer and the second semiconductor layer.

2. The semiconductor light emitting element according to claim 1, wherein a thickness of the insulator layer is 10 to 750 nm, a thickness of the transparent electrode layer is 20 to 400 nm, and a thickness of the second pad electrode is 400 to 2000 nm.

3. The semiconductor light emitting element according to claim 1, wherein a shape of an opening of the hole portion in the insulator layer is circular or substantially circular, and an area of the opening is not more than 80% of a contact area between the insulator layer and the second semiconductor layer.

4. The semiconductor light emitting element according to claim 2, wherein a shape of an opening of the hole portion in the insulator layer is circular or substantially circular, and an area of the opening is not more than 80% of a contact area between the insulator layer and the second semiconductor layer.

5. The semiconductor light emitting element according to claim 3, wherein an average diameter of the hole portion of the insulator layer is not less than 16 μm.

6. The semiconductor light emitting element according to claim 4, wherein an average diameter of the hole portion of the insulator layer is not less than 16 μm.

7. The semiconductor light emitting element according to claim 1, wherein the first semiconductor layer is disposed on a predetermined substrate.

8. A semiconductor light emitting device having a plurality of the semiconductor light emitting elements according to claim 7, wherein at least two of the semiconductor light emitting elements are connected in series.

9. A semiconductor light emitting device having a plurality of semiconductor light emitting elements according to claim 1 disposed on a predetermined substrate, wherein at least two of the semiconductor light emitting elements are connected in series.

10. A semiconductor light emitting device having a plurality of semiconductor light emitting elements according to claim 2 disposed on a predetermined substrate, wherein at least two of the semiconductor light emitting elements are connected in series.

11. A semiconductor light emitting device having a plurality of semiconductor light emitting elements according to claim 3 disposed on a predetermined substrate, wherein at least two of the semiconductor light emitting elements are connected in series.

12. A semiconductor light emitting device having a plurality of semiconductor light emitting elements according to claim 6 disposed on a predetermined substrate, wherein at least two of the semiconductor light emitting elements are connected in series.

13. The semiconductor light emitting element according to claim 2, wherein the first semiconductor layer is disposed on a predetermined substrate.

14. The semiconductor light emitting element according to claim 3, wherein the first semiconductor layer is disposed on a predetermined substrate.

15. The semiconductor light emitting element according to claim 6, wherein the first semiconductor layer is disposed on a predetermined substrate.

16. A semiconductor light emitting device having a plurality of the semiconductor light emitting elements according to claim 13, wherein at least two of the semiconductor light emitting elements are connected in series.

17. A semiconductor light emitting device having a plurality of the semiconductor light emitting elements according to claim 14, wherein at least two of the semiconductor light emitting elements are connected in series.

18. A semiconductor light emitting device having a plurality of the semiconductor light emitting elements according to claim 15, wherein at least two of the semiconductor light emitting elements are connected in series.

19. The semiconductor light emitting element according to claim 1,
wherein the insulator layer includes a core portion and an extending portion extending from the core portion, the hole portion passes through the core portion, and the second pad electrode includes a core portion disposed on the core portion of the insulator layer and extending portions of the second pad electrode disposed on the extending portions of the insulator layer.

20. A semiconductor light emitting device having a plurality of the semiconductor light emitting elements according to claim 8,
wherein the insulator layer includes a core portion and an extending portion extending from the core portion, the hole portion passes through the core portion, and the second pad electrode includes a core portion disposed on the core portion of the insulator layer and extending portions of the second pad electrode disposed on the extending portions of the insulator layer.

* * * * *